(12) United States Patent
Kosyachkov et al.

(10) Patent No.: US 7,556,721 B2
(45) Date of Patent: Jul. 7, 2009

(54) THIOSILICATE PHOSPHOR COMPOSITIONS AND DEPOSITION METHODS USING BARIUM-SILICON VACUUM DEPOSITION SOURCES FOR DEPOSITION OF THIOSILICATE PHOSPHOR FILMS

(75) Inventors: Alexander Kosyachkov, Mississauga (CA); Vincent Joseph Alfred Pugliese, Oakville (CA); Joe Acchione, Caledon (CA); Stephen Charles Cool, Mississauga (CA)

(73) Assignee: IFIRE IP Corporation, Fort Saskatchewan, Alberta (CA)

( * ) Notice: Subject to any disclaimer, the term of this patent is extended or adjusted under 35 U.S.C. 154(b) by 549 days.

(21) Appl. No.: 11/260,927

(22) Filed: Oct. 29, 2005

(65) Prior Publication Data

US 2006/0091000 A1    May 4, 2006

Related U.S. Application Data

(60) Provisional application No. 60/622,842, filed on Oct. 29, 2004.

(51) Int. Cl.
C23C 14/34 (2006.01)
C23C 16/00 (2006.01)

(52) U.S. Cl. .............. 204/192.26; 204/192.12; 427/64; 427/69; 427/457

(58) Field of Classification Search ............ 204/192.12, 204/192.26; 427/64, 69, 457
See application file for complete search history.

(56) References Cited

U.S. PATENT DOCUMENTS

| 4,365,184 | A | 12/1982 | Higton et al. |
| 4,507,562 | A | 3/1985 | Gasiot et al. |
| 4,884,860 | A | 12/1989 | Brown |
| 4,947,046 | A * | 8/1990 | Kawabata et al. ........ 250/484.4 |
| 5,432,015 | A | 7/1995 | Wu et al. |
| 6,303,051 | B1 | 10/2001 | Diaz et al. |
| 6,447,654 | B1 | 9/2002 | Kosyachkov |
| 6,610,352 | B2 | 8/2003 | Cheong |
| 6,621,211 | B1 | 9/2003 | Srivastava et al. |
| 6,776,927 | B2 | 8/2004 | Mitomo et al. |
| 6,793,782 | B2 | 9/2004 | Kosyachkov |

(Continued)

FOREIGN PATENT DOCUMENTS

DE    20218718 U1    5/2004

(Continued)

OTHER PUBLICATIONS

International Search Report, PCT/CA2005/001647, Int'l Filing Date Oct. 28, 2005, Canadian Intellectual Property Office, ISA/CA, Authorized Officer Michael M. Morgovsky, Completed Feb. 7, 2006.

*Primary Examiner*—Rodney G McDonald
(74) *Attorney, Agent, or Firm*—Fay Sharpe LLP (57) ABSTRACT

The present invention relates to novel thiosilicate phosphor compositions. The invention is further a physical vapor deposition method for the deposition of rare earth activated thiosilicate phosphor compositions comprising providing at least one or more source materials where the source materials may comprise a barium silicon alloy, an intermetallic barium silicon compound, a protected barium metal and combinations thereof; providing an activator species; and effecting deposition of the one or more source materials and activator species as a thin film phosphor composition on a selected substrate. The method allows for the deposition of blue thin film electroluminescent phosphors with high luminance and colors required for TV applications.

47 Claims, 3 Drawing Sheets

U.S. PATENT DOCUMENTS

| | | |
|---|---|---|
| 2003/0087129 A1 | 5/2003 | Miura et al. |
| 2003/0118864 A1 | 6/2003 | Kosyachkov |
| 2004/0027047 A1 | 2/2004 | Matsuda et al. |
| 2004/0189547 A1 | 9/2004 | Wang et al. |
| 2004/0206935 A1 | 10/2004 | Miura et al. |

FOREIGN PATENT DOCUMENTS

| | | |
|---|---|---|
| WO | WO 03/056056 A2 | 7/2003 |
| WO | WO2004/055231 A2 | 7/2004 |
| WO | WO 2005/085493 A1 | 9/2005 |

\* cited by examiner

THIOSILICATE PHOSPHOR COMPOSITIONS AND DEPOSITION METHODS USING BARIUM-SILICON VACUUM DEPOSITION SOURCES FOR DEPOSITION OF THIOSILICATE PHOSPHOR FILMS

This application claims the benefit of U.S. Provisional Application Ser. No. 60/622,842, filed Oct. 29, 2004, the disclosure of which is incorporated herein by reference.

FIELD OF THE INVENTION

The present invention relates to novel thiosilicate phosphor compositions and methods for deposition thereof in full colour ac thick film dielectric electroluminescent displays. More specifically, the invention is a novel physical vapour deposition method for depositing thiosilicate thin film phosphor compositions using one or more source materials that comprise barium and a source of silicon.

BACKGROUND OF THE INVENTION

Thick film dielectric structures as described in U.S. Pat. No. 5,432,015 (the disclosure of which is incorporated herein by reference in its entirety) provide superior resistance to dielectric breakdown as well as a reduced operating voltage as compared to thin film electroluminescent (TFEL) displays. The thick film dielectric structure as deposited on a ceramic substrate will withstand somewhat higher processing temperatures than TFEL devices, which are typically fabricated on glass substrates. This increased high temperature tolerance facilitates annealing of phosphor films at higher temperatures to improve their luminosity. However, even with this enhancement, it is still desirable to improve display luminance and colour co-ordinates to keep pace with ongoing improvements to cathode ray tube (CRT) displays, particularly with recent trends in CRT specifications to higher luminance and higher colour temperature.

A high luminance blue-emitting electroluminescent phosphor is desirable in electroluminescent colour displays to achieve adequate luminosity. Blue light emitting phosphor materials such as activated barium thioaluminates provide excellent blue colour co-ordinates and higher luminance, but as a ternary compound, its stoichiometry is also somewhat difficult to control. Vacuum deposition of barium thioaluminate phosphor films comprising this material from a single sulfide source pellet using sputtering or electron beam evaporation has yielded films with adequately high luminosity.

A useful approach that has been adopted to control the stoichiometry of thioaluminate phosphors is to use two separate sources for deposition. This approach requires added controls over the relative deposition rates for the different sources. U.S. Pat. No. 6,447,654 discloses the sputtering of barium thioaluminate phosphor films from a single target comprising aluminum sulfide and barium sulfide and optionally magnesium to deposit blue-emitting barium thioaluminate or barium magnesium thioaluminate phosphor materials. The stoichiomentry of the deposited film is adjusted by adjusting the target composition to account for differential condensation rates of the target elements on the phosphor film substrate. However, this method does not fully solve the problem of providing a stable phosphor film during display operation and at the same time providing a method that can be used for the economic deposition of phosphor films over large areas.

The Applicant's co-pending U.S. Pat. No. 6,793,782 discloses the sputtering of two targets to deposit a rare earth activated barium thioaluminate phosphor film. One of the sputtering targets comprises aluminum while the other sputtering target comprises europium doped barium sulfide. The sputtering is carried out in a low pressure atmosphere of hydrogen sulfide to provide sufficient sulfur content in the deposited film. The use of two sputtering targets facilitates modulation of the relative deposition rate of materials arising from each source which in turn facilitates deposition of a laminated film with a periodic composition alternately rich and poor in aluminum. The variation can be achieved by using a rotating or oscillating substrate that is alternately-positioned in the flux of atomic species sputtered from the respective targets. To the extent that the atomic flux from the two sources are spatially separated from one another, and to the extent that hydrogen sulfide is present in the sputtering chamber, a film can be deposited with a composition that is alternately aluminum sulfide and rare earth doped barium sulfide. The thickness of the layers can be altered by changing the rotation rate or the oscillation rate of the substrate. In this method, however, the composition modulation across the thickness of the deposited layer may be problematical for subsequent reaction of the deposited materials to form a homogeneous single phase phosphor material, since atomic species are required to diffuse within the deposited film to achieve a homogeneous composition on an atomic scale.

The Applicant's co-pending International Patent ApplicationPCT/CA03/01887 discloses the use of composite sputtering targets that can somewhat reduce the composition modulation problem discussed above. The composite sputtering target comprises an europium doped barium sulfide particle as an inclusion phase in an aluminum matrix. While such composite sputtering targets reduce the composition modulation problem, there may still remain some issues with respect to the stability of the barium sulfide when it is exposed to the ambient environment and the introduction of impurities such as oxygen or hydroxide into the deposited film due to sputtering of these species as impurities in the barium sulfide target with air and moisture. These problems have been addressed through the use of reactive sputtering using barium aluminum alloy targets in conjunction with aluminum targets in a hydrogen sulfide atmosphere as disclosed in Applicant's co-pending PCT/CA2005/000333.

Cerium and europium activated barium thiosilicate phosphors are known that exhibit blue photoluminescence and cathodoluminescence, however, these known phosphors have not been demonstrated to exhibit electroluminescence. More specifically, $Ba_2SiS_4$ and $BaSi_2S_5$ phosphors activated with cerium or europium (with ratios of silicon to barium of 2:1 or 1:2) have been suggested be useful as blue-emitting electroluminescent phosphor materials however, there is no data to support this hypothesis.

It is therefore desirable to develop methods for deposition of alternate thin film phosphor compositions for thick film dielectric electroluminescent displays where the compositions have lower CIE y coordinates for blue and that are also increasingly stable when in contact with the ambient environment during processing. This will enable a less stringent manufacturing environment leading to more cost effective manufacturing and to further obviate one or more of the disadvantages of the prior art methods.

SUMMARY OF THE INVENTION

The present invention provides for novel thin film thiosilicate phosphor compositions. The invention also provides a novel physical vapour deposition method for the deposition of cerium activated electroluminescent phosphor compositions comprising rare earth activated barium thiosilicate. More specifically, the thin film phosphor compositions comprise cerium activated barium thiosilicate and are useful as phosphors for full colour ac electroluminescent displays, particularly those employing thick film dielectric layers with a high dielectric constant. The invention provides a lower CIE y coordinate for light emitted from the phosphor within a full colour ac electroluminescent display as compared to known europium activated barium thioaluminate compositions.

According to an aspect of the present invention, there is provided a physical vapour deposition method for the deposition of thiosilicate phosphor compositions, the method comprising:
providing at least one or more source materials, said one or more source materials comprising a barium silicon alloy, an intermetallic barium silicon compound and a protected barium metal;
providing an activator species; and
effecting deposition of said one or more source materials and said activator species as a phosphor composition on a selected substrate.

In aspects of the invention, the physical vapour deposition method is effected in a sulfur-bearing vapour atmosphere.

According to another aspect of the present invention, there is provided a physical vapour deposition method for the deposition of a thin film thiosilicate phosphor composition, the method comprising:
providing at least one or more source materials, said one or more source materials comprising a barium silicon alloy, an intermetallic barium silicon compound and a protected barium metal;
providing an activator species to said one or more source materials or separately; and
effecting deposition of said one or more source materials and said activator species in a sulfur-bearing vapour atmosphere as a thin film thiosilicate phosphor composition on a selected substrate.

According to yet another aspect of the present invention, there is provided a physical vapour deposition method for the deposition of a barium thiosilicate phosphor composition, the method comprising:
providing a source material comprising a composite of barium metal and a barium silicon intermetallic compound;
providing an activator species; and
effecting deposition of said source material and said activator species in a sulfur-bearing vapour atmosphere as a phosphor composition on a selected substrate.

According to still another aspect of the present invention, there is provided a physical vapour deposition method for the deposition of a barium thiosilicate phosphor composition, the method comprising:
providing a barium silicon alloy source material comprising $BaSi_2$ and an activator species; and
effecting deposition of said source material and said activator species in a sulfur vapour atmosphere as a phosphor composition on a selected substrate.

According to a further aspect of the present invention, there is provided a thin film rare earth activated thiosilicate electroluminescent phosphor composition.

According to still a further aspect of the invention is a thin film rare earth activated thiosilicate electroluminescent phosphor composition, said composition comprising a ratio of silicon to barium in the range of about 0.7 to 1.3 and in further aspects in the range of about 0.9 to 1.1.

According to another aspect of the present invention, there is provided a thin film rare earth activated barium thiosilicate composition with the nominal formula $BaSi_xS_{1+2x}$:RE wherein RE is a rare earth element, and in aspects is cerium. In a further aspect 0.7<x<1.3.

According to still another aspect of the present invention, there is provided a thin film rare earth activated barium thiosilicate composition with the nominal formula $BaSi_xS_{1+2x}$:Ce wherein 0.9<x<1.1.

According to still another aspect of the present invention, there is provided a white light-emitting thin film cerium activated barium thiosilicate composition, said composition comprising a ratio of silicon to barium in the range of about 0.6 to about 0.7.

Other features and advantages of the present invention will become apparent from the following detailed description. It should be understood, however, that the detailed description and the specific examples while indicating embodiments of the invention are given by way of illustration only, since various changes and modifications within the spirit and scope of the invention will become apparent to those skilled in the art from said detailed description.

BRIEF DESCRIPTION OF THE DRAWINGS

The present invention will become more fully understood from the description given herein, and from the accompanying drawings, which are given by way of illustration only and do not limit the intended scope of the invention.

DETAILED DESCRIPTION OF THE INVENTION

The invention is a novel method for the deposition of thiosilicate phosphor compositions for use in electroluminescent displays, and in particular, electroluminescent displays employing thick film dielectric layers. The method of the invention is a physical vapour deposition method that is well suited to novel blue light emitting phosphor rare earth activated barium thiosilicates. The method provides for the deposition of phosphors with improved blue emission spectrum when used within electroluminescent displays. The method is also relatively simple and is applicable for the economic deposition of phosphor films over large areas. The invention is also directed to the thiosilicate phosphor compositions deposited by the novel method disclosed herein, and in particular thin film rare earth activated thiosilicate electroluminescent phosphor compositions.

In aspects, the method of the invention is a physical vapour deposition method that can be selected from sputtering, electron beam evaporation or thermal evaporation and utilizes one or more source materials to deposit a thiosilicate phosphor composition. As a sputtering method, the method employs one or more metallic sputtering targets as the source material(s). As an electron beam or thermal evaporation method, the method employs one or more evaporation pellets as the source material(s). The sputtering targets or evaporation pellets may comprise a barium silicon alloy, an intermetallic barium silicon compound, a protected barium metal and combinations thereof. Additional source materials may be further provided in order that the deposited phosphor has the desired composition. Where the source material is a protected barium metal a further source comprising silicon is required. Such further source may be selected from elemental silicon or a silicon sulfide compound such as $SiS_2$.

In the method, an activator species selected to provide the desired light emission colour is also added to the one or more source materials. Alternatively, the activator species can be provided separately from the one or more source materials. Suitable activator species include rare earth elements and in aspects the activator may be cerium.

According to a first aspect of the present invention, the source material is a barium silicon alloy used as the sputtering target or evaporation pellet. The use of barium silicon alloys simplifies controlling the vapour species removed from the targets or pellets due to their simple chemical composition. Prior art methods for depositing rare earth activated thiosilicate compositions use targets or pellets comprising silicon and barium sulfides doped with cerium. The vapour species that emanate from pellets or targets of cerium doped barium sulfide may comprise $Ce_2S_3$, Ce, BaS, Ba, or $S_2$ depending on the evaporation temperature or sputtering conditions. The type and relative flux of these various species that emanate may vary with fluctuations in the sputtering power, sputtering atmosphere, or pellet temperature for thermal evaporation, creating fluctuations in the composition of the deposited film due to the different sticking coefficients for the various vapour species. By contrast, in the present invention, desirably the only species that can emanate from the pellets or targets are elemental Ba, Si and Ce vapours.

The barium silicon alloy is a composition represented by the chemical formula $Ba_xSi$ where x is in the range of about 0.5 to about 2.2 and in certain aspects of the invention is in the range of about 1.8 to about 2.2. It comprises a phase mixture of barium and intermetallic compounds of barium and silicon. Additional sputtering targets or evaporation pellets and a sulfur-bearing process gas such as hydrogen sulfide may also be used within the deposition chamber to make up the balance of the composition of the deposited phosphor film composition. The additional source materials (targets/pellets) may comprise elemental silicon or silicon sulfide compounds. The activator species is selected from a rare earth element such as cerium and may be incorporated into the barium silicon alloy source material or into any of the additional source materials used to make up the desired composition of the deposited phosphor film composition.

According to a further aspect of the present invention the source material(s) is an intermetallic barium silicon compound such as BaSi or $BaSi_2$. An activator species selected to provide the desired light emission colour is also added to the intermetallic barium silicon compound. Additional barium source materials and a sulfur-bearing process gas for a reactive thermal evaporation process are used to make up the balance of the composition of the deposited film.

According to yet a further aspect of the present invention the source material is a protected barium metal that prevents the barium metal from reacting quickly in air to form barium oxide, barium hydroxide or barium carbonate. In this aspect, one or more further source materials are used to deposit a thiosilicate film by reactive sputtering. These further source materials may be elemental silicon, a silicon sulfide compound or a source of elemental sulphur such as hydrogen sulfide, barium disulfide or strontium disulfide. However, in this case, it should be ensured that the barium does not sputter or evaporate at a rate different than the silicon, to prevent the target composition from changing as it is eroded during the deposition process and consequently also change the composition of the deposited film.

The protected barium metal may also be a barium metal covered with a volatile passivating film to enable the pellet to be handled in air prior at its being positioned in the evaporation/deposition chamber. The passivating film may be a layer of a non-protic solvent or mixtures thereof that can be evaporated away in the vacuum chamber when it is evacuated as is understood by one of skill in the art. The vapour pressure of the passivating non-protic solvent should be sufficiently low to provide adequate working time in air to facilitate handling of the source material(s), but sufficiently high that it can be evaporated away when the deposition chamber is evacuated and heated without reacting with the barium. The passivating film may also comprise a dense layer of barium oxide, barium sulfate or other inert barium compound that provides adequate protection for the barium during handling in air, but that can be removed by heating of the source material(s) prior to the deposition of barium. The layer can be formed by exposing the barium to atmosphere or to an inert atmosphere containing low concentratons of oxygen, sulfur dioxide and/or hydrogen sufide for a time sufficient to create a functional passivation layer. The thickness of the passivating layer may vary from a few atomic diameters to a micrometer or more, depending on the desired functional properties of the passivation layer and the conditions under which the barium is to be handled prior to being evaporated in the deposition chamber. If the barium metal is handled in an ambient environment where the relative humidity is held as low as possible, the passivation layer may be made thinner. It is possible to control the working ambient atmosphere to a humidity as low as about 1% by using a dry-room with special dehumidification system that employs chemical absorption wheels that absorb moisture from recirculated and make-up air in a final dehumidification step as known in the general humidity control art.

The method of the invention is suitable for the deposition of rare earth activated thiosilicate based phosphors and preferably, for the deposition of rare earth activated barium thiosilicate thin film phosphors which emit a blue light. The value for x, the amount of barium, in the composition of the deposited phosphor film composition can be adjusted to correspond to the nominal composition $Ba_2SiS_4$:Ce or $BaSi_2S_5$:Ce, both of which are blue-emitting phosphor materials by changing the composition of the barium alloy source material; by varying the relative deposition rate from the barium silicon source material(s); and by the presence of any silicon or silicon sulfide source materials used in the method. The thin film rare earth activated thiosilicate electroluminescent phosphor composition of the invention in aspects comprises a ratio of silicon to barium in the range of about 0.7 to 1.3 and in further aspects in the range of about 0.9 to 1.1. Exemplitive rare earth activated barium thiosilicate compositions have the nominal formula $BaSi_xS_{1+2x}$:RE wherein RE is a rare earth element, and in aspects is cerium. In further aspect 0.7<x 1.3. The thin film rare earth activated barium thioaluminate compositions may also have the nominal formula $BaSi_xS_{1+2x}$:Ce wherein 0.9<x<1.1.

The method of the present invention as a reactive sputtering deposition method can be done in any contemporary rf magnetron, dc, pulsed dc or pulsed ac sputtering system such as those marketed by Edwards, Ulvac, Leybold, etc. that is fitted with a gas injection and exhaust system capable of handling hydrogen sulfide or other sulfur-containing vapours and has a deposition substrate heating means. Sputtering may be conducted at power levels of about 3 to 5 watts per $cm^2$. The method of the present invention can also be conducted as a thermal evaporation method as is understood by one of skill in the art. The method of the present invention may also be effected using electron beam evaporation as is also understood by one of skill in the art.

The phosphors as deposited by the methods of the invention are incorporated within an electroluminescent device that may incorporate a variety of substrate structures. Such devices are disclosed for example in Applicant's U.S. Patent Application No. 2003/0224221 (the disclosure of which is incorporated herein in its entirety). In particular, the substrate structure comprises a thick film ceramic material having a base substrate which is a ceramic sheet having an electrically conductive film deposited thereon with a thick film dielectric layer deposited on the film. Examples of suitable base substrates are glass or ceramic sheet materials that include but are not limited to alumina, metal ceramic composites, glass ceramic materials and high temperature glass materials. Suitable electrically conductive films are known to those of skill in the art such as, but not limited to, gold and silver alloy. The thick film layer comprises ferroelectric material. Suitable ferroelectric materials may be selected from lead magnesium niobate titanate, lead zirconate titanate, barium titanate and mixtures thereof. The thick film layer may be as described in Applicant's co-pending PCT/CA02/01932 (the disclosure of which is incorporated herein by reference in its entirety). The thick film layer may also comprise one or more thin film layers thereon.

The deposition of the composition may be carried out in an atmosphere of $H_2S$, sulphur or other volatile sulphur bearing compounds such as with the use of a polysulfide compound to ensure that the deposited phosphor composition will not be deficient in sulphur. Deposition as conducted in a hydrogen sulfide atmosphere ensures that deposited species in the film can react with sulfide derived from the hydrogen sulfide to adequately saturate the deposited film with sulfide and achieve the desired film composition. However, it may be also be possible to operate the method in a low pressure sulfur vapour-containing atmosphere without $H_2S$. An oxygen-free environment may not be necessary.

Figure 1:
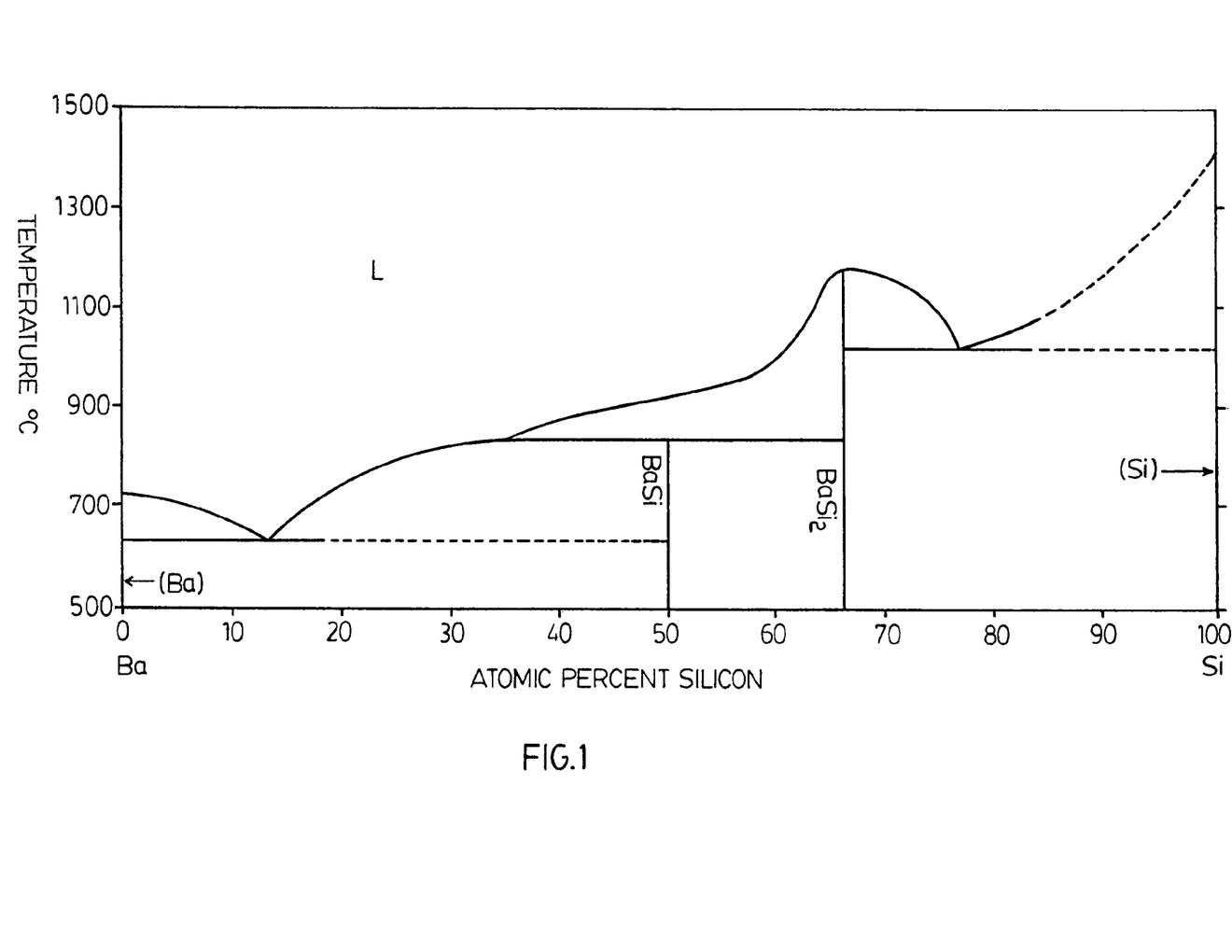
FIG. 1 shows a drawing of the binary phase diagram for barium and silicon.

In one representative embodiment of the present invention, the method is a reactive sputtering deposition method for deposition of a barium thiosilicate phosphor film. The source material is a single sputtering target comprising a barium silicon alloy having a composition $Ba_xSi$ where x is in the range of about 1.9 to about 2.1 and in aspects about 2. With reference to the binary phase diagram of FIG. 1, for the barium silicon system, the target comprises equal parts of Ba metal and the intermetallic compound BaSi.

In another representative embodiment of the invention, the method is an electron beam or thermal evaporation method for deposition of a cerium activated barium thiosilicate phosphor film. In such method two source materials are used, one consisting of barium metal and the other consisting of elemental silicon.

In summary, the present invention is a novel physical vapour deposition process for depositing multi-element thin cerium activated phosphor film compositions for electroluminescent displays in which the phosphors have a high, yet uniform luminosity and suitable emission colour.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLE 1

Two cylindrical 7.6 centimeter diameter sputtering targets were prepared, one consisting of pure silicon and the other of compacted barium sulfide doped with 3 mole percent $Ce_2S_3$. The targets were installed in an Edwards model FL400 rf magnetron sputtering system and a cerium activated barium thiosilicate film was deposited by reactive rf sputtering on silicon substrates held at a temperature of about 330° C. The sputtering atmosphere was a 3:1 mixture of argon and hydrogen sulfide at pressures in the range of 0.06 to 0.11 Pa. The rf power applied to the doped barium sulfide target was 5.5 watts per square centimeter and the power to the silicon target was varied to obtain films with different ratios of barium to silicon. Films with a thickness of about 400 nanometers were produced with ratios of rf power to the silicon target to rf power to the doped barium sulphide target ranging from 0 to 1. The substrates with the deposited films were annealed under nitrogen in a belt furnace at a peak temperature of 730° C. for about 6 minutes.

Figure 2:
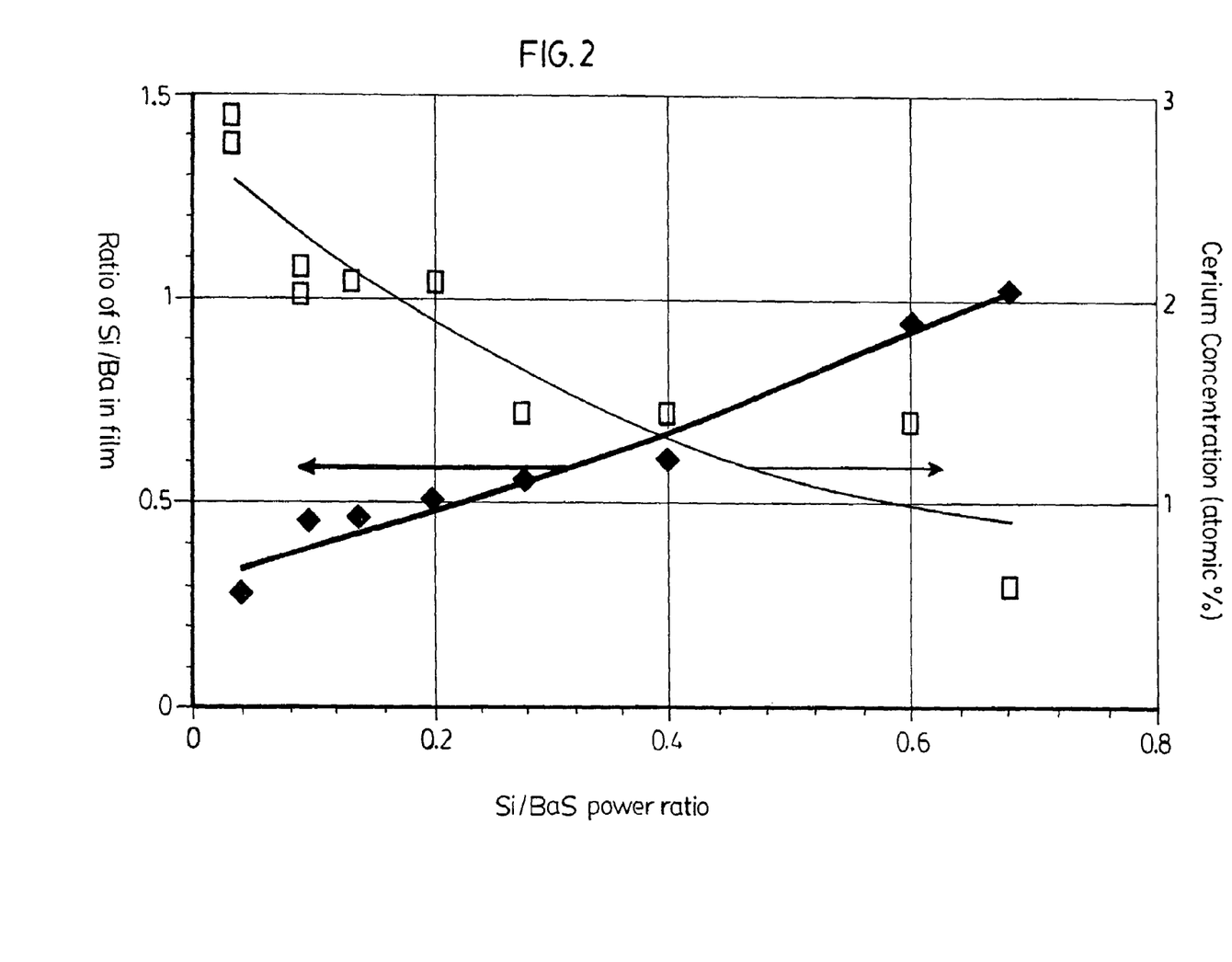
FIG. 2 is a graph showing the relationship between the silicon to barium ratio in sputtered thiosilicate phosphor films and the ratio of the power applied to the silicon target and the power applied to the barium sulfide target respectively used to deposit the films.

The composition of films subject to the same deposition and annealing procedures but deposited on graphite substrates was measured using energy dispersive x-ray analysis (EDX). FIG. 2 shows the relationship between the ratio of barium to aluminum and the atomic cerium concentration in the deposited films and the ratio of the power applied to the deposition targets.

The photoluminescence of the films was measured using a 254 nanometer excitation source. The film with no power applied to the silicon target showed yellow photoluminescence typical of BaS:Ce. A film with a silicon to barium ratio of about 0.27 did not exhibit blue photoluminescence in response to excitation at but a film with a higher ratio of 0.45 showed blue photoluminance. A film with a silicon to barium ratio of 0.6 again did not show photoluminescence whereas films with higher silicon to barium ratios of 0.9 and 1.0 did show photoluminance with a CIE y coordinate of 0.09

This example shows that for selected ranges of the silicon to barium ratio, cerium activated barium thiosilicate compositions exhibit photoluminescence.

EXAMPLE 2

Thick dielectric electroluminescent devices were constructed on 5 centimeter by 5 centimeter glass substrates according to the methods of U.S. Pat. No. 6,589,674 and PCT patent application publication no. WO03/056879 (the disclosures of which are hereby incorporated by reference in their entirety) that incorporated cerium activated barium thiosilicate phosphor films having different silicon to barium ratios similar to those of example 1. The phosphor film was sandwiched between a lower thin dielectric layer comprising alumina and an upper thin film dielectric layer comprising aluminum nitride. The electroluminescence of the devices was measured. Those having phosphor films with a silicon to barium ratio of 0.95 and 1.0 showed electroluminescence when they were driven with alternating polarity 30 microsecond pulses with a peak voltage 60 volts above the threshold voltage for the devices of about 170 volts at a pulse repetition rate of 240 Hz. The luminance for the former device was 5 candelas per square meter with a CIE y coordinate of 0.12. The luminance for the latter device was 4 candelas per square meter with a CIE y coordinate of 0.14. This is the first reported measurement of electroluminescence from a device with a thin film cerium activated barium thiosilicate phosphor.

X-ray diffraction studies of phosphor films with silicon to barium ratios in the range of 0.45 to 0.95 showed diffraction peaks at angles corresponding to a compound having a crystal structure with the same lattice parameters as the compound $Ba_2SiS_4$, but with significantly different diffracted beam intensities from each other and from the expected intensities for $Ba_2SiS_4$. The integrated intensity of the diffracted beams was highest for the film with a silicon to barium ratio of 0.6, which is close to the ratio for compound $Ba_2SiS_4$, but the films that exhibited electroluminescence had a silicon to barium ratio near 1 and only about 30% of the integrated intensity for the film having a silicon to barium ratio of 0.6. This suggests that a previously unknown amorphous thiosilicate phase is responsible for the electroluminescence.

EXAMPLE 3

Figure 3:
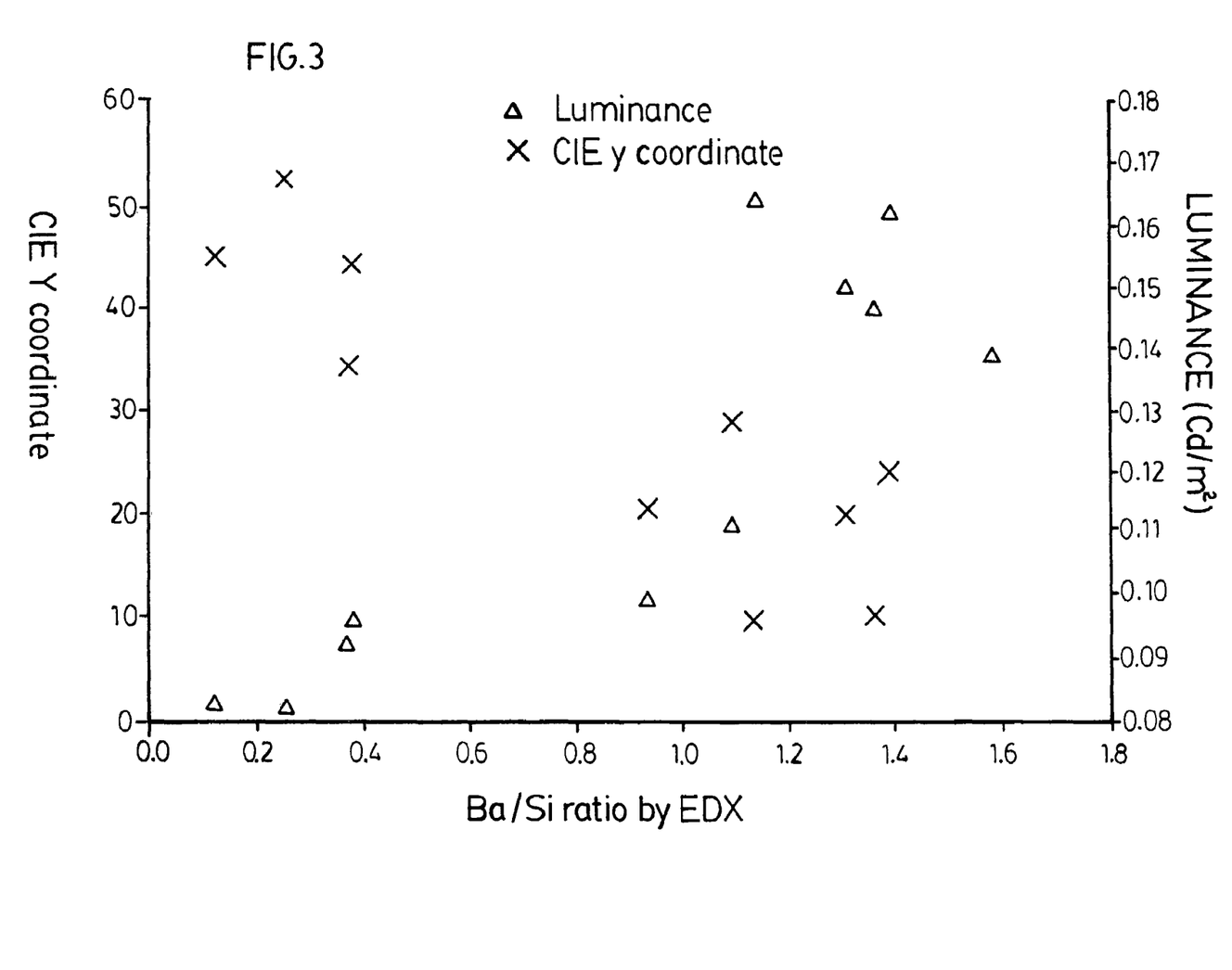
FIG. 3 is a graph showing the luminance and CIE y coordinates for electroluminescent devices having barium thiosilicate phosphor films with different ratios of barium to silicon.

Thick dielectric electroluminescent devices similar to those of Example 2 were constructed, with the exception that the cerium activated barium thiosilicate phosphor films Were deposited by electron beam evaporation rather than sputtering. Two evaporation sources, one of barium sulfide doped with cerium and the other silicon sulphide. The two source materials were evaporated simultaneously and the ratio of silicon to barium in the deposited phosphor films was varied by controlling the power applied to the two sources. The barium to silicon ratio for the deposited films was measured by placing a graphite substrate in proximity to the substrates during deposition and measuring the silicon and barium concentrations in the films deposited on the graphite substrate using energy dispersive x-ray analysis (EDX). Devices with ratios of barium to silicon ranging from 0.1 to 1.55 were fabricated. The electroluminescence and CIE y coordinate of the devices was measured as shown in FIG. 3 when they were driven with alternating polarity 30 microsecond pulses with a peak voltage 60 volts above the threshold voltage for the devices of about 170 volts at a pulse repetition rate of 240 Hz. As can be seen from the figure the luminance increased with increasing barium to silicon ratio to a maximum of about 35 candelas per square meter and the CIE y coordinate decreased from about 0.16 to about 0.10 as the barium to silicon ratio was increased from about 0.1 to 1.3. However, for a barium to silicon ratio of 1.55, a white electroluminescence was observed, indicating an abrupt change in the electroluminescent emission mechanism over that observed at lower barium to silicon ratios.

Although preferred embodiments of the invention have been described herein in detail, it will be understood by those skilled in the art that variations may be made thereto without departing from the spirit of the invention or the scope of the appended claims.

The invention claimed is:

1. A physical vapour deposition method for the deposition of a thin film thiosilicate phosphor composition, the method comprising:
providing at least one or more source materials comprising a barium silicon alloy, an intermetallic barium silicon compound, a protected barium metal and combinations thereof;
providing an activator species; and
effecting deposition of said one or more source materials and said activator species in a sulfur vapour atmosphere as a phosphor composition on a selected substrate.

2. The method of claim 1, wherein said one or more source materials is selected from a sputtering target and an evaporation pellet.

3. The method of claim 1, wherein said barium silicon alloy is represented as $Ba_xSi$ where $0.5<x<2.2$.

4. The method of claim 3, wherein $1.8<x<2.2$.

5. The method of claim 1, wherein said intermetallic barium silicon compound is BaSi.

6. The method of claim 1, wherein said intermetallic barium silicon compound is $BaSi_2$.

7. The method of claim 1, wherein said source material is a protected barium metal and an additional source material is used in the method and is selected from the group consisting of elemental silicon, a silicon sulfide compound and a source of elemental sulfur.

8. The method of claim 1, wherein said protected barium metal comprises barium metal covered with a volatile passivating film.

9. The method of claim 8, wherein said volatile passivating film is a layer of a non-protic solvent.

10. The method of claim 8, wherein said volatile passivating film is a layer of barium oxide, barium sulfate or inert barium compound.

11. The method of claim 1, wherein said one or more source materials further comprises elemental silicon or silicon sulfide.

12. The method of claim 1, wherein said one or more source materials comprises a protected barium metal as a first source and elemental silicon or silicon sulfide as a second source.

13. The method of claim 1, wherein said sulfur vapour atmosphere is $H_2S$.

14. The method of claim 13, wherein said sulfur vapour atmosphere is generated remotely from said source materials.

15. The method of claim 14, wherein said sulfur vapour atmosphere is generated from a polysulfide compound.

16. The method of claim 1, wherein said deposition is effected by a method selected from sputtering, thermal evaporation and electron beam evaporation.

17. The method of claim 16, wherein said method is sputtering.

18. The method of claim 16, wherein said method is selected from the group consisting of electron beam evaporation and thermal evaporation.

19. The method of claim 1, wherein said activator species is selected from europium and cerium.

20. The method of claim 19, wherein said activator species is cerium.

21. The method of claim 19, wherein said activator species is incorporated within said one or more source materials.

22. The method of claim 19, wherein said activator species is provided separate from said one or more source materials.

23. The method of claim 3, wherein said method comprises a single source material of a barium silicon alloy, said activator species is provided doped within said compound and a sulfur source is incorporated within said compound.

24. The method of claim 5, wherein said method comprises a single source material comprising an intermetallic barium silicon compound, an activator species and sulfur.

25. A physical vapour deposition method for the deposition of a thin film thiosilicate phosphor composition, the method comprising:
providing at least one or more source materials comprising a barium-silicon alloy, an intermetallic barium silicon compound, a protected barium metal and combinations thereof;

providing an activator species to said one or more source materials or separately; and effecting deposition in a sulfur vapour atmosphere of said source materials and said activator species as a phosphor composition on a selected substrate.

26. The method of claim 25, wherein said intermetallic barium silicon compound is BaSi.

27. The method of claim 25, wherein intermetallic barium silicon compound is $BaSi_2$.

28. The method of claim 25, wherein said barium silicon alloy is represented as $Ba_xSi$ where $0.5<x<2.2$.

29. The method of claim 28, wherein $1.8<x<2.2$.

30. The method of claim 25, wherein said source material is a protected barium metal and an additional source material is used in the method and is selected from the group consisting of elemental silicon, a silicon sulfide compound and a source of elemental sulfur.

31. The method of claim 25, wherein said protected barium metal comprises barium metal covered with a volatile passivating film.

32. The method of claim 31, wherein said volatile passivating film is a layer of a non-protic solvent.

33. The method of claim 25, wherein said one or more source materials further comprises elemental silicon or a silicon suifide compound.

34. The method of claim 25, wherein said phosphor composition represented as $Ba_2SiS_{54}RE$ where RE is a rare earth element selected from europium and cerium.

35. The method of claim 25, wherein said sulfur vapour atmosphere is $H_2S$.

36. The method of claim 35, wherein said sulfur vapour atmosphere is generated remotely from said source materials.

37. The method of claim 35, wherein said sulfur vapour atmosphere is generated from a polysulfide compound.

38. The method of claim 25, wherein said deposition is effected by a method selected from sputtering, thermal evaporation and electron beam evaporation.

39. The method of claim 25, wherein said activator species is selected from europium and cerium.

40. The method of claim 39, wherein said activator species is cerium.

41. The method of claim 39, wherein said activator species is incorporated within said one or more source materials.

42. The method of claim 39, wherein said activator species is provided separate from said one or more source materials.

43. A physical vapour deposition method for the deposition of a barium thiosilicate phosphor composition, the method comprising:

providing a source material comprising $Ba_xSi$ where $0.5<x<2.2$ and an activator species; and effecting deposition of said source material and said activator species as a phosphor composition on a selected substrate in a sulfur vapour atmosphere.

44. The method of claim 43, wherein said sulfur vapour atmosphere is $H_2S$.

45. The method of claim 11, wherein said sulfur vapour atmosphere is $H_2S$.

46. The method of claim 4, wherein said method comprises a single source material of a barium silicon alloy, said activator species is provided doped within said compound and a sulfur source is incorporated within said compound.

47. The method of claim 6, wherein said method comprises a single source material comprising an intermetallic barium silicon compound, an activator species and sulfur.

* * * * *